United States Patent
Chen et al.

(10) Patent No.: US 11,108,264 B2
(45) Date of Patent: Aug. 31, 2021

(54) BATTERY MANAGEMENT SYSTEM

(71) Applicant: CYBER POWER SYSTEMS, INC., Taipei (TW)

(72) Inventors: Ta-Peng Chen, Taipei (TW); Yung-Hao Peng, Taipei (TW); Hung-Ming Hsieh, Taipei (TW)

(73) Assignee: CYBER POWER SYSTEMS, INC., Taipei (TW)

(*) Notice: Subject to any disclaimer, the term of this patent is extended or adjusted under 35 U.S.C. 154(b) by 267 days.

(21) Appl. No.: 16/445,918

(22) Filed: Jun. 19, 2019

(65) Prior Publication Data
US 2020/0127489 A1   Apr. 23, 2020

(30) Foreign Application Priority Data

Oct. 19, 2018 (CN) .......................... 201811219742.8

(51) Int. Cl.
| | |
|---|---|
| H02J 9/06 | (2006.01) |
| G01R 31/374 | (2019.01) |
| G01R 31/3842 | (2019.01) |
| G01R 31/36 | (2020.01) |

(52) U.S. Cl.
CPC .......... *H02J 9/061* (2013.01); *G01R 31/3648* (2013.01); *G01R 31/374* (2019.01); *G01R 31/3842* (2019.01)

(58) Field of Classification Search
CPC ..................................................... H02J 9/061
USPC .......................................................... 702/63
See application file for complete search history.

(56) References Cited

U.S. PATENT DOCUMENTS

| | | | |
|---|---|---|---|
| 9,756,570 B1* | 9/2017 | Ramachandra | H04N 19/132 |
| 2015/0046106 A1* | 2/2015 | Wade | H04Q 9/00 |
| | | | 702/63 |
| 2016/0172901 A1* | 6/2016 | Hsieh | G01R 31/382 |
| | | | 307/66 |

(Continued)

FOREIGN PATENT DOCUMENTS

CA    106154167 A    11/2016

OTHER PUBLICATIONS

Wang Huaq-Qiang, Tao Xing-Qiao; Zigbee Pu; "Design of PU Reactor Temperature Monitoring Based on Zigbee and Cloud Platform"; dated Jun. 2017.

*Primary Examiner* — Ricky Go
(74) *Attorney, Agent, or Firm* — Bacon & Thomas, PLLC

(57) ABSTRACT

The present invention provides a battery management system, which is applicable to at least one battery string, wherein each battery string comprises a plurality of batteries connected in series. The battery management system comprises a plurality of battery sensors and a main controller. Each battery sensor measures at least one corresponding battery and has a first communication module, and each battery sensor issues a broadcast through the first communication module when its power is activated. The main controller has a second communication module. The second communication module and the first communication modules are signal connected in parallel. The main controller executes a web server program to provide a web page. When the main controller receives the broadcast, the main controller displays an addressing interface by the web page, so as to assign each battery sensor to at least one corresponding battery to complete the addressing of the battery sensors.

72 Claims, 11 Drawing Sheets

(56) References Cited

U.S. PATENT DOCUMENTS

2017/0110907 A1* 4/2017 Grehan ................ G01R 31/40

* cited by examiner

FIG. 2

BATTERY MANAGEMENT SYSTEM

BACKGROUND OF THE INVENTION

Field of the Invention

The present invention relates to the technical field of battery management, and in particular, to a battery management system.

Description of Related Art

For now, the uninterruptible power system (UPS) in the data center needs to be connected with a plurality of battery strings, so as to supply power to the required equipment when AC mains fails. To monitor the status of each battery of these battery strings, a plurality of battery sensors are typically disposed on the batteries, respectively, and are connected to a main controller for centralized management.

In order to perform the above-described centralized management, the battery sensors must be addressed so that the main controller can obtain the correspondence between the batteries and the battery sensors. An existing practice is to dispose a plurality of buttons on the battery sensors, respectively, so that the installer can sequentially press the buttons in the field to sequentially address the battery sensors.

However, when the battery density of the data center is high, this addressing manner will cause great inconvenience to the installer.

SUMMARY OF THE INVENTION

An object of the present invention is to provide a battery management system, which allows an installer to address a plurality of battery sensors more easily.

To achieve the above object, the present invention provides a battery management system, which is applicable to at least one battery string, wherein each battery string comprises a plurality of batteries connected in series. The battery management system comprises a plurality of battery sensors and a main controller. Each battery sensor is configured to measure at least one corresponding battery and has a first communication module, and each battery sensor is configured to issue a broadcast through the first communication module when its power is activated. The main controller has a second communication module, and the second communication module and the first communication modules are signal connected in parallel. The main controller is configured to execute a web server program to provide a web page. When the main controller receives the broadcast, the main controller displays an addressing interface by the web page, so as to assign each battery sensor to at least one corresponding battery to complete the addressing of the battery sensors.

In order to make the above objects, technical features and gains after actual implementation more obvious and easy to understand, in the following, the preferred embodiments will be described with reference to the corresponding drawings and will be described in more detail.

BRIEF DESCRIPTION OF THE DRAWINGS

Other features and advantages of the present invention will become apparent in the following detailed description of the preferred embodiments with reference to the accompanying drawings, of which:

FIG. 2 shows an addressing interface according to an embodiment of the present invention.

DESCRIPTION OF EMBODIMENTS

The characteristics, contents, advantages and achieved effects of the present disclosure will become more fully understood from the detailed description given herein below and the accompanying drawings which are given by way of illustration only, and thus are not limitative of the present disclosure.

As required, detailed embodiments are disclosed herein. It must be understood that the disclosed embodiments are merely exemplary of and may be embodied in various and alternative forms, and combinations thereof. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Figure 1:
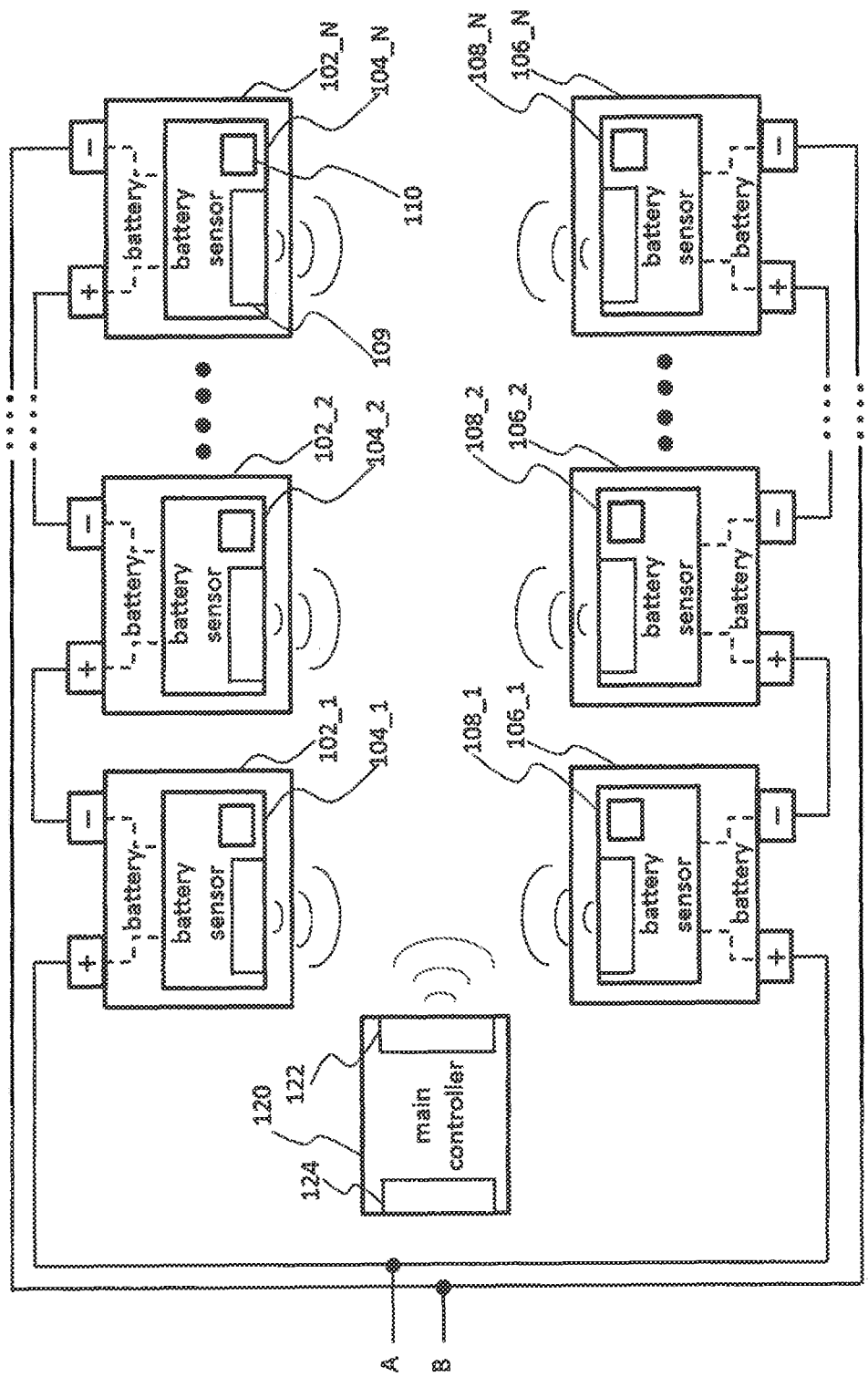
FIG. 1 shows a battery management system according to an embodiment of the present invention and shows two battery strings.

FIG. 1 shows a battery management system according to an embodiment of the present invention and shows two battery strings. As shown in FIG. 1, one of the battery strings is composed of serially connected batteries 102_1-102_N, and the other battery string is composed of serially connected batteries 106_1-106_N. The positive terminals of the batteries 102_1 and 106_1 are electrically coupled to the positive input terminal A of an uninterruptible power system, and the negative terminals of the batteries 102_N and 106_N are electrically coupled to the negative input terminal B of the uninterruptible power system.

The battery management system comprises a main controller 120, battery sensors 104_1-104_N, and battery sensors 108_1-108_N. Each of the battery sensors is configured to measure at least one corresponding battery. In this embodiment, each battery sensor is electrically coupled to the positive terminal and the negative terminal of a corresponding battery, thereby receiving power supplied by the corresponding battery and sensing the state of the corresponding battery. In addition, each battery sensor comprises a communication module (as indicated by reference numeral 109) and a display device (as indicated by reference numeral 110), and each battery sensor issues a broadcast through the communication module 109 when its power is activated. In this embodiment, the communication modules 109 of the battery sensors are all wireless communication modules.

As for the main controller 120, it comprises a communication module 122. In this embodiment, the communication module 122 is also a wireless communication module, and the communication module 122 and the communication modules 109 of the battery sensors described above are signal connected in parallel.

The main controller 120 is configured to execute a web server program to provide a web page. When the main controller 120 receives a broadcast, the main controller 120 displays an addressing interface by the web page, so as to assign each battery sensor to a corresponding battery to complete the addressing of the battery sensors (this will be described later). In addition, the main controller 120 further comprises a communication module 124, so as to signal connect a remote device via the communication module 124. In this embodiment, the communication module 124 can be implemented by a wired communication module or a wireless communication module. The remote device is configured to execute a browser program, thereby allowing a user to browse the web page. Thus, the user can execute or input at least one operation command through the web page.

Figure 2:
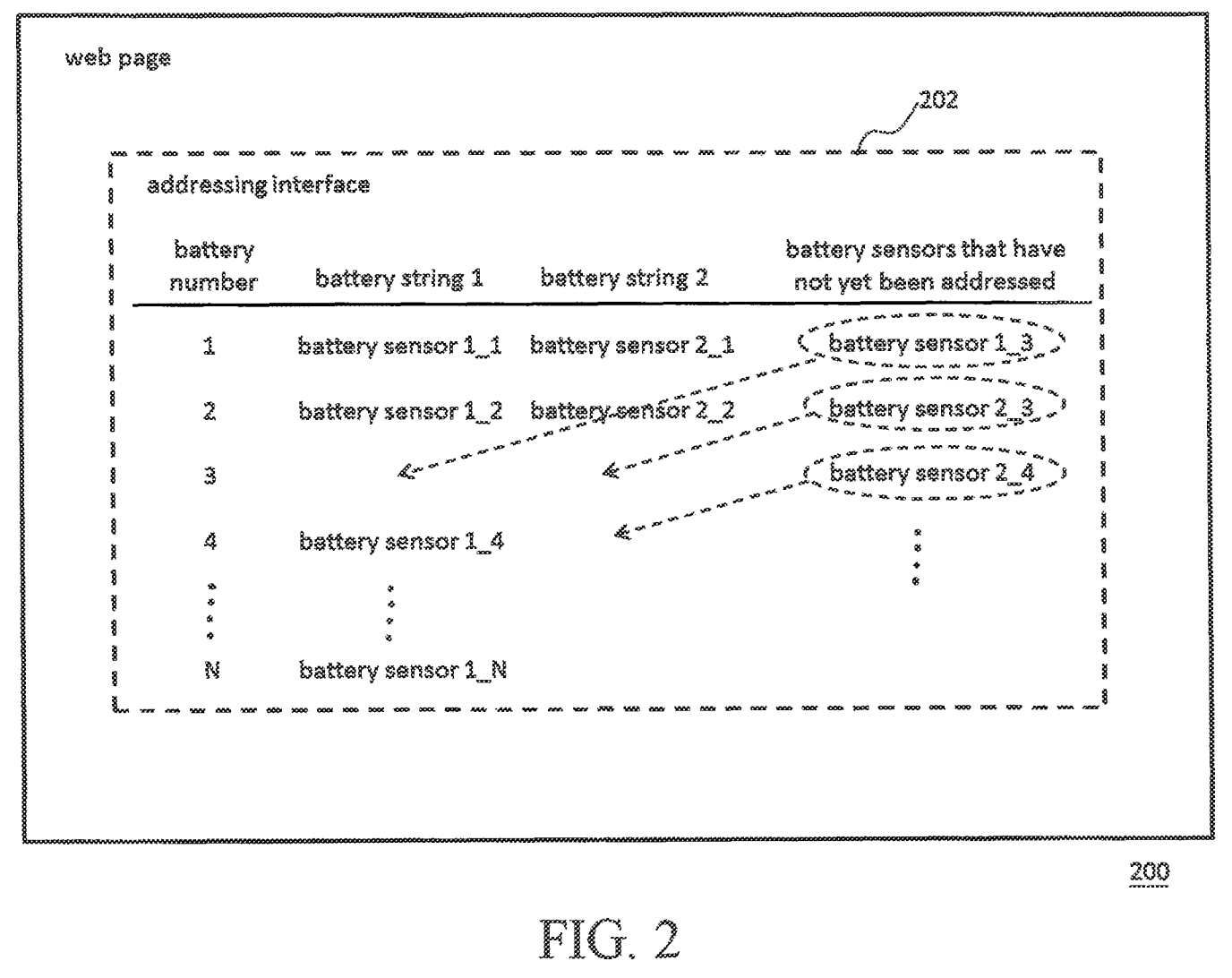

FIG. 2 shows an addressing interface according to an embodiment of the present invention. As shown in FIG. 2, the web page 200 provided by the main controller 120 is configured to display an addressing interface 202, and the addressing interface 202 is configured to display information on which batteries have been assigned battery sensors and which batteries have not been assigned battery sensors. The addressing interface 202 is also configured to display information on which battery sensors have issued broadcasts but have not been addressed, so as to allow a drag operation to complete the addressing of the battery sensors. For example, from the information currently displayed on the addressing interface 202, it can be seen that in the battery string 1 only the third battery has not been assigned a battery sensor. Therefore, a user can drag the battery sensor 1_3 in the addressing interface 202 to the position of the third battery of the battery string 1 to complete the addressing of the battery sensor 1_3.

Figure 3:
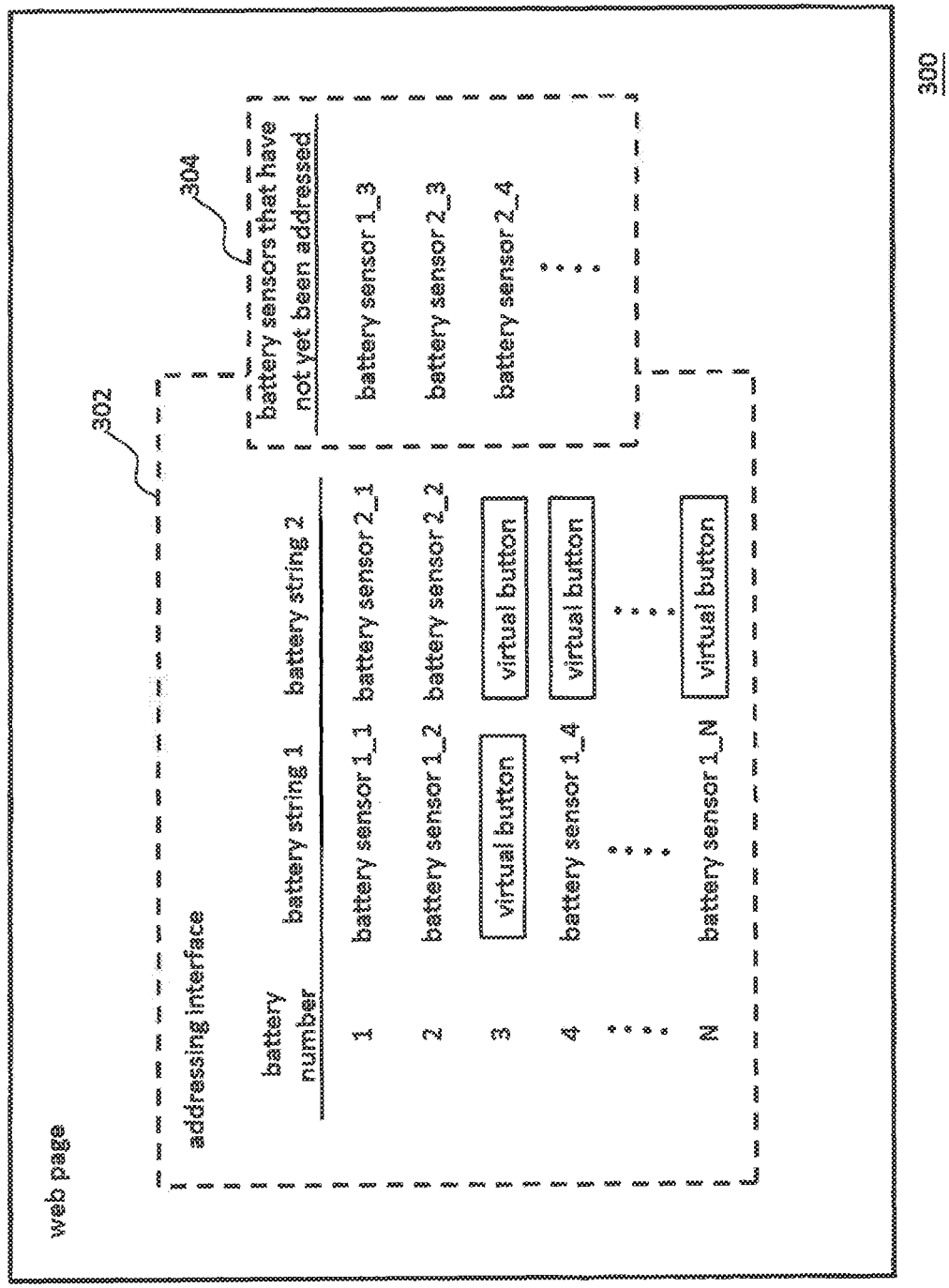
FIG. 3 shows an addressing interface according to another embodiment of the present invention.

Certainly, the addressing interface can be presented in other forms, as illustrated by FIG. 3. FIG. 3 shows an addressing interface according to another embodiment of the present invention. As shown in FIG. 3, the web page 300 provided by the main controller 120 is configured to display the addressing interface 302, and the addressing interface 302 is configured to display information on which batteries have been assigned battery sensors and which batteries have not been assigned battery sensors. In addition, in this addressing interface 302, each battery that has not been assigned a battery sensor is represented by a virtual button. When any one of the virtual buttons is clicked, information 304 pops up on the web page 300, and it shows that which battery sensors have issued broadcasts but have not been addressed, so as to allow a click operation to complete the addressing of a corresponding battery sensor. For example, from the information currently displayed on the addressing interface 302, it can be seen that in the battery string 1 only the third battery has not been assigned a battery sensor. Therefore, when a user clicks its corresponding virtual button, information 304 pops up on the web page 300, and it shows that which battery sensors have issued broadcasts but have not been addressed. Then, the user can click the battery sensor 1_3 in the information 304 to complete the addressing of the battery sensor 1_3.

In another embodiment, when any one of the virtual buttons in the addressing interface 302 is clicked, a pull-down menu (not shown) is displayed. The pull-down menu is configured to display information on which battery sensors have issued broadcasts but have not been addressed, so as to allow a click operation to complete the addressing of a corresponding battery sensor.

In yet another embodiment, when any one of the virtual buttons in the addressing interface 302 is clicked, a setting wizard interface (not shown) pops up to guide a user to address a corresponding battery sensor.

In still another embodiment, the main controller 120 can perform automatic addressing. For example, after displaying, by the addressing interface, information on which batteries have been assigned battery sensors and which batteries have not been assigned battery sensors, the main controller 120 automatically assigns the battery sensors to the corresponding batteries according to the receiving sequence of the broadcasts, so as to complete the addressing of the battery sensors, and the main controller 120 displays the correspondence between the battery sensors and the batteries by the addressing interface.

When the battery sensors are all addressed, the main controller 120 can further write the addressing information of each battery sensor into a memory space (not shown) of a corresponding battery sensor. The addressing information comprises information on which battery of the battery strings the battery sensor belongs to. In this way, each battery sensor can display its addressing information by its display device 110. The display device 110 can be implemented by a liquid-crystal display (LCD), an electrophoretic display (EPD), or at least a seven-segment display. In addition, there is another advantage derived from writing the addressing information of each battery sensor into the memory space of the corresponding battery sensor, that is, when the main controller 120 is damaged or needs to be replaced, the maintenance personnel only need to replace the main controller 120 by a new main controller and then enable the new main controller to reacquire the addressing information recorded in each battery sensor. This eliminates the need for re-addressing and reduces the time required for repairs.

Figure 4:
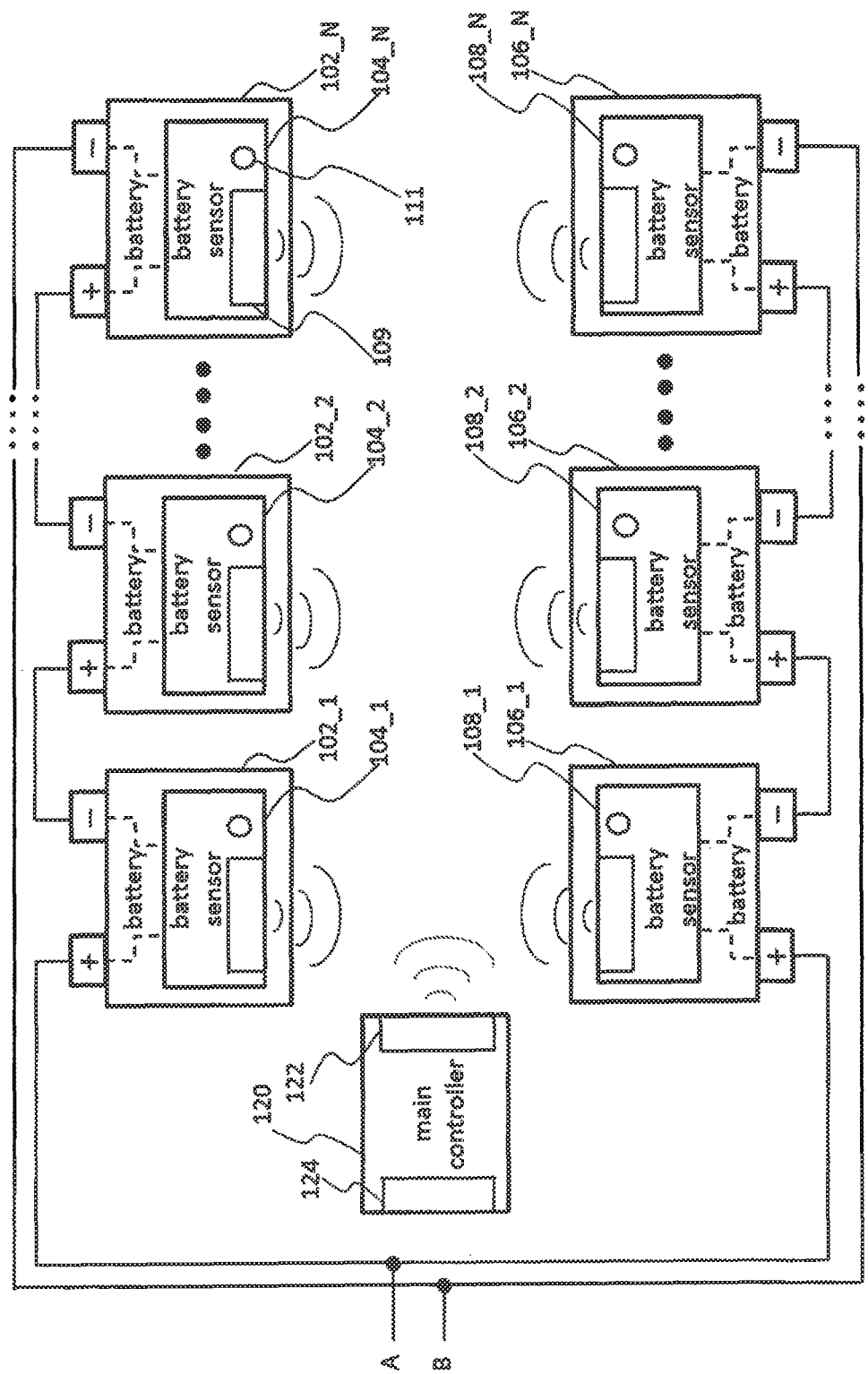
FIG. 4 shows a battery management system according to another embodiment of the present invention and shows two battery strings.

FIG. 4 shows a battery management system according to another embodiment of the present invention and shows two battery strings. In FIG. 4, the same reference numerals as those in FIG. 1 are denoted as the same objects. Compared with the battery management system shown in FIG. 1, each battery sensor in the battery management system shown in FIG. 4 uses a light emitting diode (LED, as indicated by reference numeral 111) in place of display device 110. In this way, after storing the addressing information in the memory space (not shown), each battery sensor can control its LED 111 to emit light for the installer to determine if an installation error has occurred. For example, by default, the battery sensors 104_1-104_N disposed on the batteries 102_1-120_N adopt red LEDs 111, and the battery sensors 108_1-108_N disposed on the batteries 106_1-106_N adopt green LEDs 111. Therefore, when there is any one LED of the battery sensors disposed on the batteries 102_1-120_N emits green light, and there is any one LED of the battery sensors disposed on the batteries 106_1-106_N emits red light, then the installer can determine that an installation error has occurred.

Referring to FIG. 4, in another embodiment, when the battery sensors are all addressed, the main controller 120 further controls at least one battery sensor to turn on its LED according to an operational command received from the web page. For example, the main controller 120 can control the battery sensors of one of the battery strings to simultaneously turn on their LEDs 111 according to the received operation command, control the battery sensors of one of the battery strings to sequentially turn on their LEDs 111 according to the received operation command, or control certain battery sensors to turn on their LEDs 111 according to the received operation command. Based on this, the installer can determine if an installation error has occurred.

Figure 5:
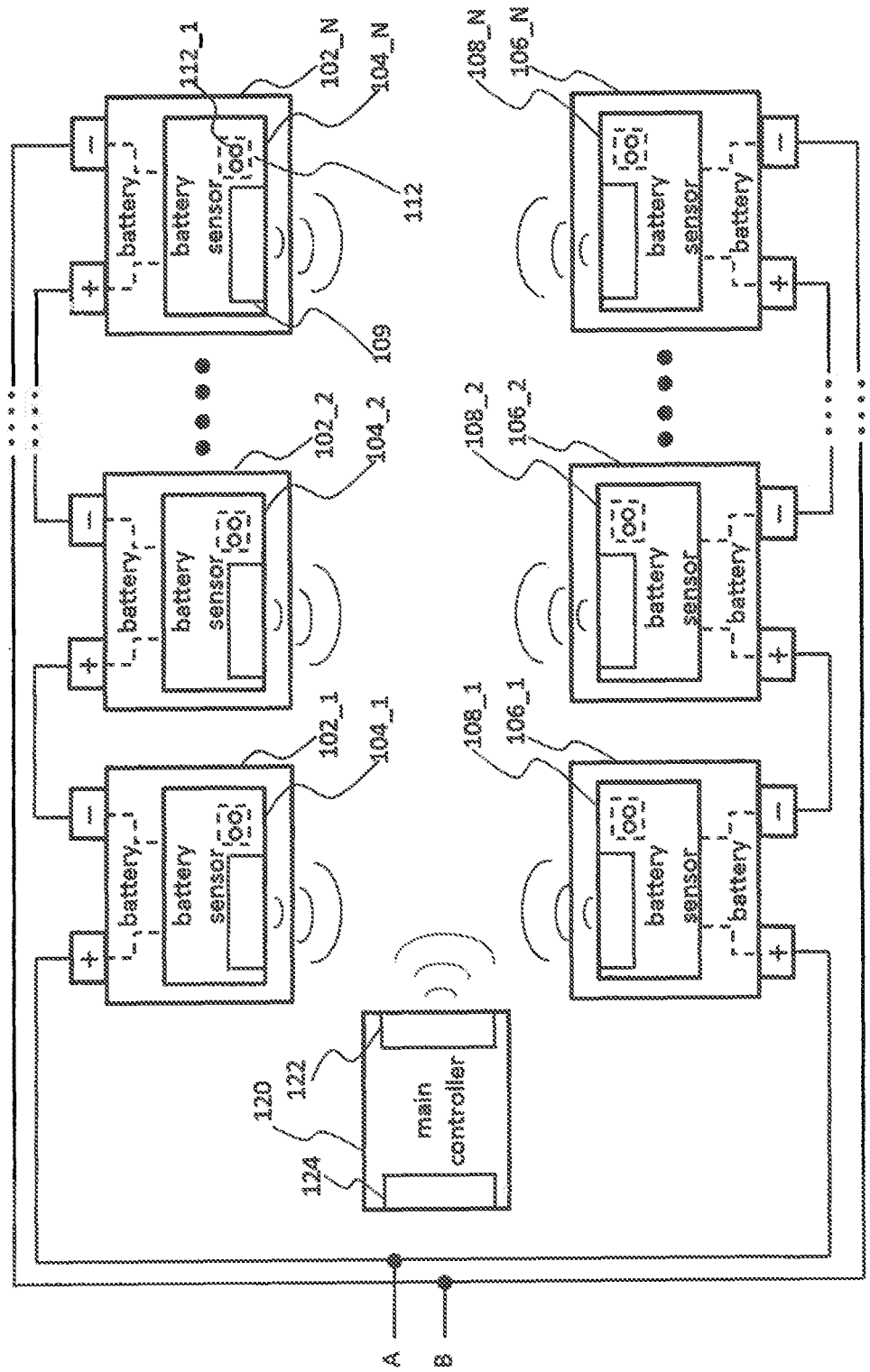
FIG. 5 shows a battery management system according to yet another embodiment of the present invention and shows two battery strings.

FIG. 5 shows a battery management system according to yet another embodiment of the present invention and shows two battery strings. In FIG. 5, the same reference numerals as those in FIG. 1 are denoted as the same objects. Compared with the battery management system shown in FIG. 1, each battery sensor in the battery management system shown in FIG. 5 uses an LED module (as indicated by reference numeral 112) in place of the display device 110. The LED module 112 comprises a plurality of different colored LEDs (as indicated by reference 112_1). Thus, after storing the addressing information in the memory space (not shown), each battery sensor can control its LED module 112 to emit light of a corresponding color for the installer to determine if an installation error has occurred. For example, by default, the battery sensors 104_1-104_N disposed on the batteries 102_1-120_N control their LED modules 112 to emit red light, and the battery sensors 108_1-108_N disposed on the batteries 106_1-106_N control their LED modules 112 to emit green light. Therefore, when there is any one LED module 112 of the battery sensors disposed on the batteries 102_1-120_N emits green light, and there is any one LED module 112 of the battery sensors disposed on the batteries 106_1-106_N emits red light, then the installer can determine that an installation error has occurred.

Referring to FIG. 5, in another embodiment, when the battery sensors are all addressed, the main controller 120 further controls at least one battery sensor to turn on its LED module 112 to emit light of a corresponding color according to an operational command received from the web page. For example, the main controller 120 can control the LED modules 112 of one of the battery strings to simultaneously emit red light according to the received operation command, control the LED modules 112 of one of the battery strings to sequentially emit red light according to the received operation command, or control certain LED modules 112 to emit red light according to the received operation command. Based on this, the installer can determine if an installation error has occurred.

Figure 6:
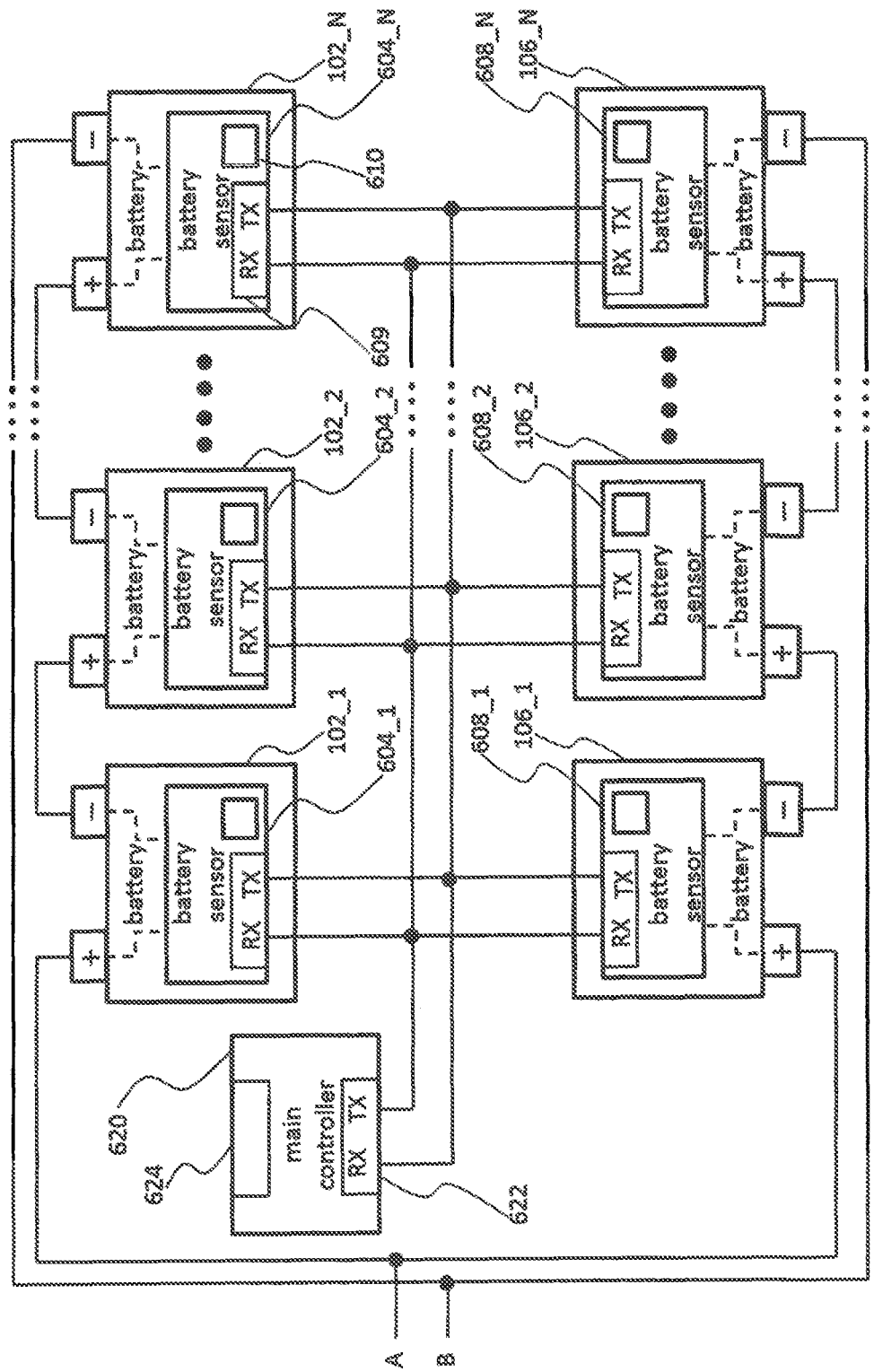
FIG. 6 shows a battery management system according to yet another embodiment of the present invention and shows two battery strings.

FIG. 6 shows a battery management system according to yet another embodiment of the present invention and shows two battery strings. Referring to FIG. 6, the battery management system comprises a main controller 620, battery sensors 604_1-604_N, and battery sensors 608_1-608_N. Compared with the battery management system shown in FIG. 1, the battery management system shown in FIG. 6 is different in that the communication module (as indicated by reference numeral 609) of each battery sensor is implemented by a wired communication module, and the communication module 622 of the main controller 620 is also implemented by a wired communication module. As shown in FIG. 6, the transmitting terminal TX of the communication module 622 of the main controller 620 is signal connected to the receiving terminals RX of the communication modules 609 of the battery sensors, and the receiving terminal RX of the communication module 622 of the main controller 620 is signal connected to the transmitting terminals TX of the communication modules 609 of the battery sensors. In other words, the communication module 622 and the communication modules 609 of the battery sensors described above are signal connected in parallel.

Each battery sensor issues a broadcast through the communication module 609 when its power is activated. The main controller 620 is configured to execute a web server program to provide a web page. When the main controller 620 receives a broadcast, the main controller 620 displays an addressing interface by the web page, so as to assign each battery sensor to a corresponding battery to complete the addressing of the battery sensors.

In addition, the main controller 620 further comprises a communication module 624. The communication module 624 can be implemented by a wired communication module or a wireless communication module. Thus, the main controller 620 can signal connect a remote device via the communication module 624. The remote device is configured to execute a browser program, thereby allowing a user to browse the web page. Thus, the user can execute or input at least one operation command through the web page.

In addition, each battery sensor further comprises a display device (as indicated by reference numeral 610) such that each battery sensor can display its addressing information through its display device 610. The display device 610 can be implemented by an LCD, an EPD, or at least a seven-segment display. Certainly, the display device 610 of each battery sensor can be replaced by an LED or an LED module. In addition, each battery sensor further comprises a memory space (not shown) for storing addressing information.

Figure 7:
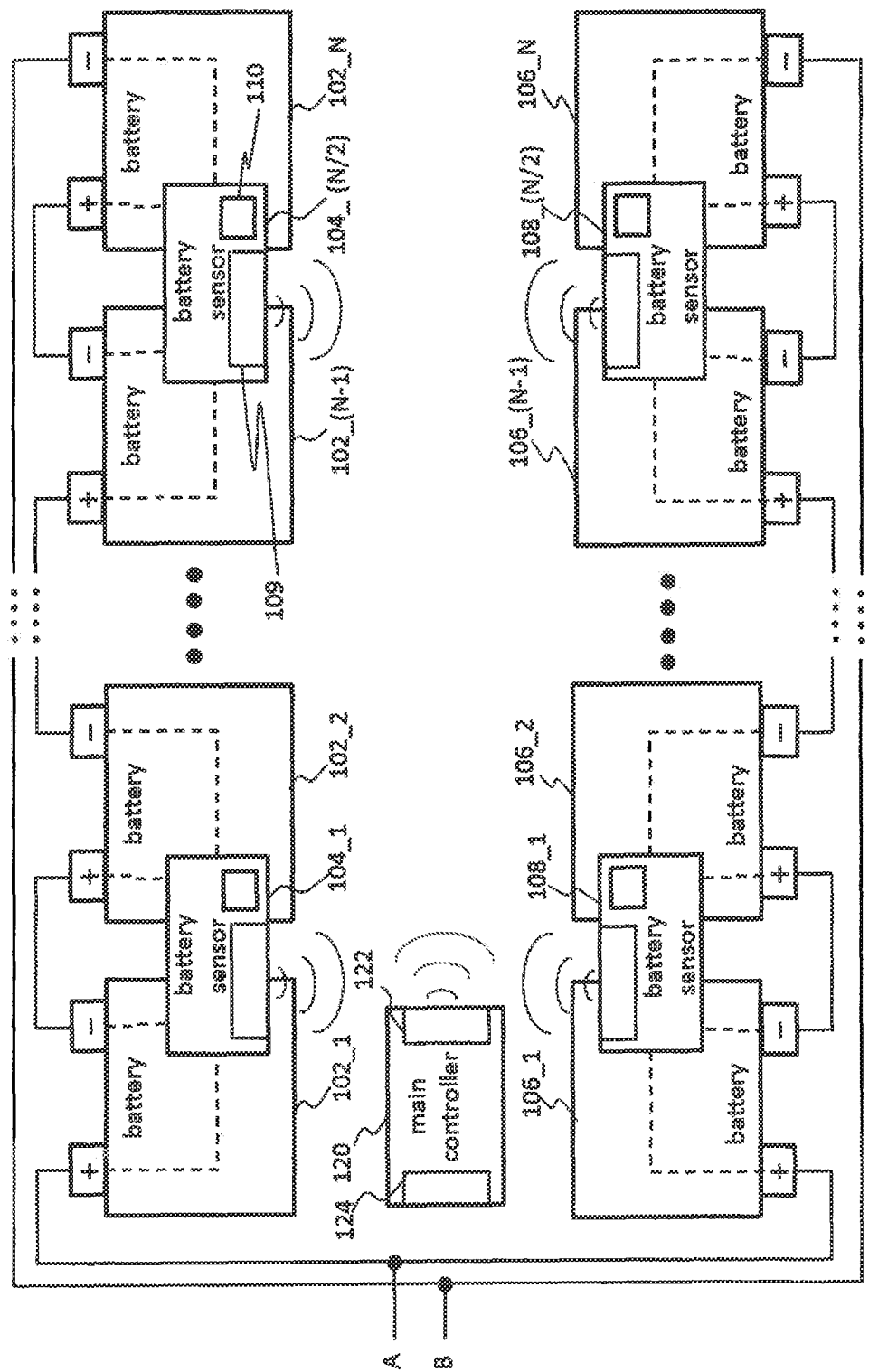
FIG. 7 shows a battery management system according to yet another embodiment of the present invention and shows two battery strings.

FIG. 7 shows a battery management system according to yet another embodiment of the present invention and shows two battery strings. In FIG. 7, the same reference numerals as those in FIG. 1 are denoted as the same objects. Compared with the battery management system shown in FIG. 1, the main controller 120 in the battery management system shown in FIG. 7 divides the batteries into a plurality of battery groups. Each of the battery groups comprises K batteries, wherein K is a natural number. In this embodiment, K is 2. In addition, each battery sensor is electrically coupled to the positive terminal and the negative terminal of each battery of a corresponding battery group, thereby receiving power supplied by each corresponding battery and sensing the state of each corresponding battery. With this configuration, the number of battery sensors required can be reduced. In the embodiment shown in FIG. 7, the number of battery sensors required is reduced by half.

Each battery sensor issues a broadcast through the communication module 109 when its power is activated. The main controller 120 is configured to execute a web server program to provide a web page. When the main controller 120 receives a broadcast, the main controller 120 displays an addressing interface by the web page, so as to assign each battery sensor to a corresponding battery group to complete the addressing of the battery sensors (this will be described later). In addition, the main controller 120 further signal connects a remote device via the communication module 124. The remote device is configured to execute a browser program, thereby allowing a user to browse the web page. Thus, the user can execute or input at least one operation command through the web page.

Figure 8:
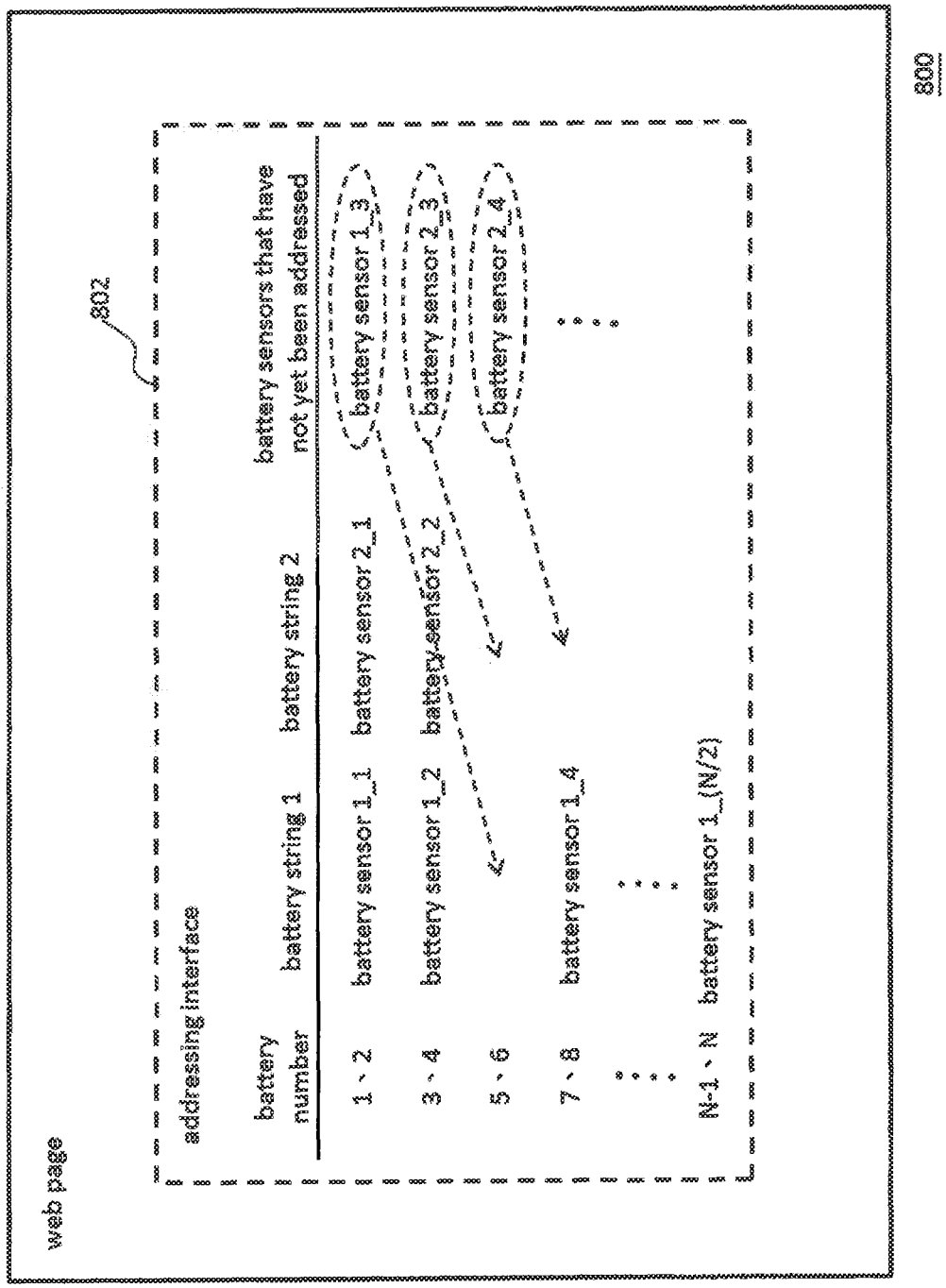
FIG. 8 shows an addressing interface according to yet another embodiment of the present invention.

FIG. 8 shows an addressing interface according to yet another embodiment of the present invention. As shown in FIG. 8, the web page 800 provided by the main controller 120 is configured to display an addressing interface 802, and the addressing interface 802 is configured to display information on which battery groups have been assigned battery sensors and which battery groups have not been assigned battery sensors. The addressing interface 802 is also configured to display information on which battery sensors have issued broadcasts but have not been addressed, so as to allow a drag operation to complete the addressing of the battery sensors. For example, from the information currently displayed on the addressing interface 802, it can be seen that in the battery string 1 only the third battery group has not been assigned a battery sensor. Therefore, a user can drag the battery sensor 1_3 in the addressing interface 802 to the position of the third battery group of the battery string 1 to complete the addressing of the battery sensor 1_3.

Figure 9:
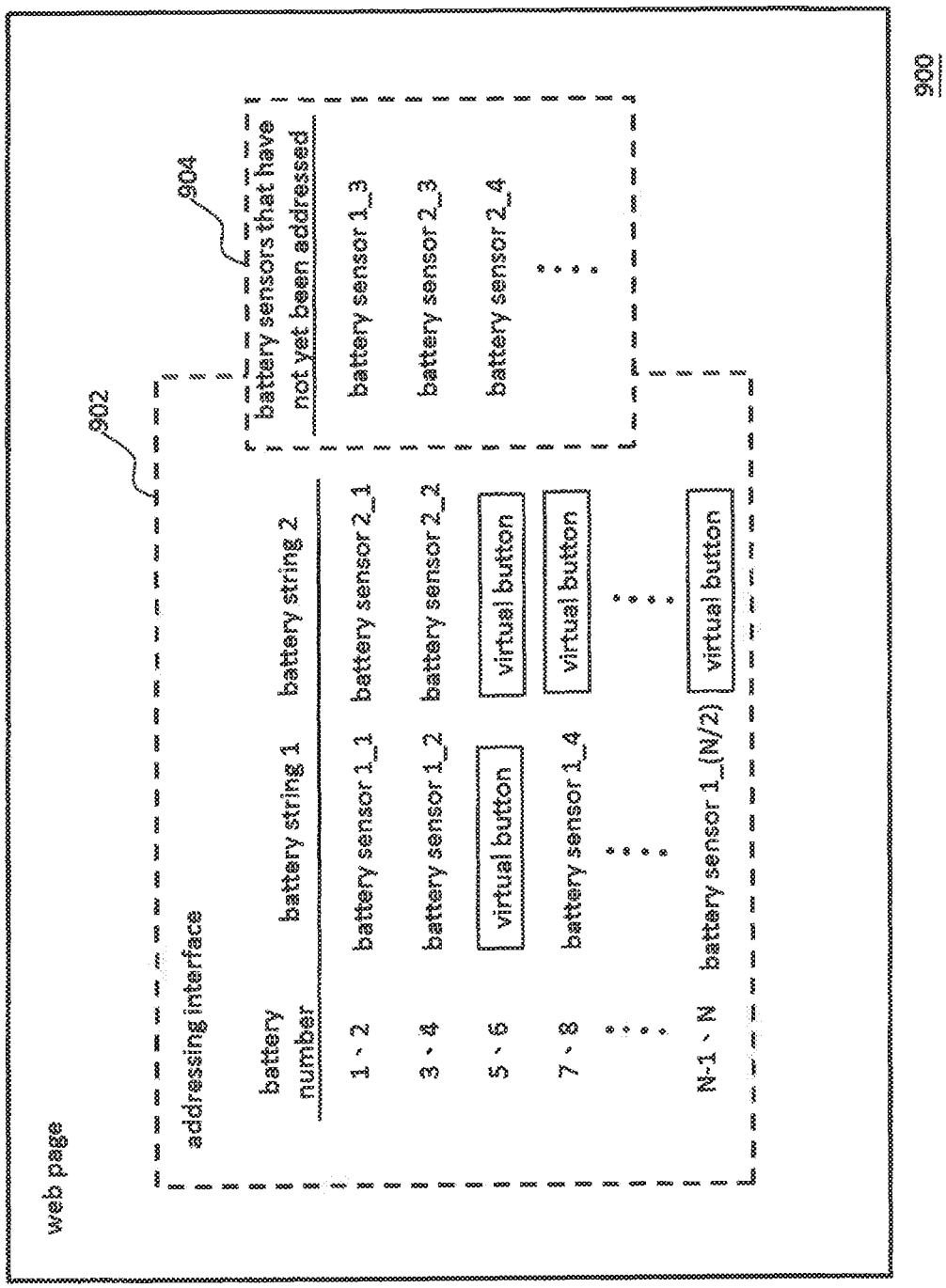
FIG. 9 shows an addressing interface according to yet another embodiment of the present invention.

Certainly, the addressing interface can be presented in other forms, as illustrated by FIG. 9. FIG. 9 shows an addressing interface according to yet another embodiment of the present invention. As shown in FIG. 9, the web page 900 provided by the main controller 120 is configured to display the addressing interface 902, and the addressing interface 902 is configured to display information on which battery groups have been assigned battery sensors and which battery groups have not been assigned battery sensors. In addition, in this addressing interface 902, each battery group that has not been assigned a battery sensor is represented by a virtual button. When any one of the virtual buttons is clicked, information 904 pops up on the web page 900, and it shows that which battery sensors have issued broadcasts but have not been addressed, so as to allow a click operation to complete the addressing of a corresponding battery sensor. For example, from the information currently displayed on the addressing interface 902, it can be seen that in the battery string 1 only the third battery group has not been assigned a battery sensor. Therefore, when a user clicks its corresponding virtual button, information 904 pops up on the web page 900, and it shows that which battery sensors have issued broadcasts but have not been addressed. Then, the user can click the battery sensor 1_3 in the information 904 to complete the addressing of the battery sensor 1_3.

In another embodiment, when any one of the virtual buttons in the addressing interface 902 is clicked, a pull-down menu (not shown) is displayed. The pull-down menu is configured to display information on which battery sensors have issued broadcasts but have not been addressed, so as to allow a click operation to complete the addressing of a corresponding battery sensor.

In yet another embodiment, when any one of the virtual buttons in the addressing interface 902 is clicked, a setting wizard interface (not shown) pops up to guide a user to address a corresponding battery sensor.

In still another embodiment, the main controller 120 can perform automatic addressing. For example, after displaying, by the addressing interface, information on which battery groups have been assigned battery sensors and which battery groups have not been assigned battery sensors, the main controller 120 automatically assigns the battery sensors to the corresponding battery groups according to the receiving sequence of the broadcasts, so as to complete the addressing of the battery sensors, and the main controller 120 displays the correspondence between the battery sensors and the battery groups by the addressing interface.

When the battery sensors are all addressed, the main controller 120 can further write the addressing information of each battery sensor into a memory space (not shown) of a corresponding battery sensor. The addressing information comprises information on which battery group of the battery strings the battery sensor belongs to. In this way, each battery sensor can display its addressing information by its display device 110. The display device 110 can be implemented by an LCD, an EPD, or at least a seven-segment display.

Certainly, the display device 110 of each battery sensor of the battery management system shown in FIG. 7 can be replaced by an LED. In this way, after storing the addressing information in the memory space (not shown), each battery sensor can control its LED to emit light for the installer to determine if an installation error has occurred. For example, by default, the battery sensors 104_1-104_(N/2) disposed on the batteries 102_1-120_N adopt red LEDs, and the battery sensors 108_1-108_(N/2) disposed on the batteries 106_1-106_N adopt green LEDs. Therefore, when there is any one LED of the battery sensors disposed on the batteries 102_1-120_N emits green light, and there is any one LED of the battery sensors disposed on the batteries 106_1-106_N emits red light, then the installer can determine that an installation error has occurred.

According to the above, in another embodiment, when the battery sensors are all addressed, the main controller 120 further controls at least one battery sensor to turn on its LED according to an operational command received from the web page. For example, the main controller 120 can control the battery sensors of one of the battery strings to simultaneously turn on their LEDs according to the received operation command, control the battery sensors of one of the battery strings to sequentially turn on their LEDs according to the received operation command, or control certain battery sensors to turn on their LEDs according to the received operation command. Based on this, the installer can determine if an installation error has occurred.

In addition, the display device 110 of each battery sensor of the battery management system shown in FIG. 7 can be replaced by an LED module. The LED module comprises a plurality of different colored LEDs. Thus, after storing the addressing information in the memory space (not shown), each battery sensor can control its LED module to emit light of a corresponding color for the installer to determine if an installation error has occurred. For example, by default, the battery sensors 104_1-104_(N/2) disposed on the batteries 102_1-120_N control their LED modules to emit red light, and the battery sensors 108_1-108_(N/2) disposed on the batteries 106_1-106_N control their LED modules to emit green light. Therefore, when there is any one LED module of the battery sensors disposed on the batteries 102_1-120_N emits green light, and there is any one LED module of the battery sensors disposed on the batteries 106_1-106_N emits red light, then the installer can determine that an installation error has occurred.

According to the above, in another embodiment, when the battery sensors are all addressed, the main controller 120 further controls at least one battery sensor to turn on its LED module to emit light of a corresponding color according to an operational command received from the web page. For example, the main controller 120 can control the LED modules of one of the battery strings to simultaneously emit red light according to the received operation command, control the LED modules of one of the battery strings to sequentially emit red light according to the received operation command, or control certain LED modules to emit red light according to the received operation command. Based on this, the installer can determine if an installation error has occurred.

Figure 10:
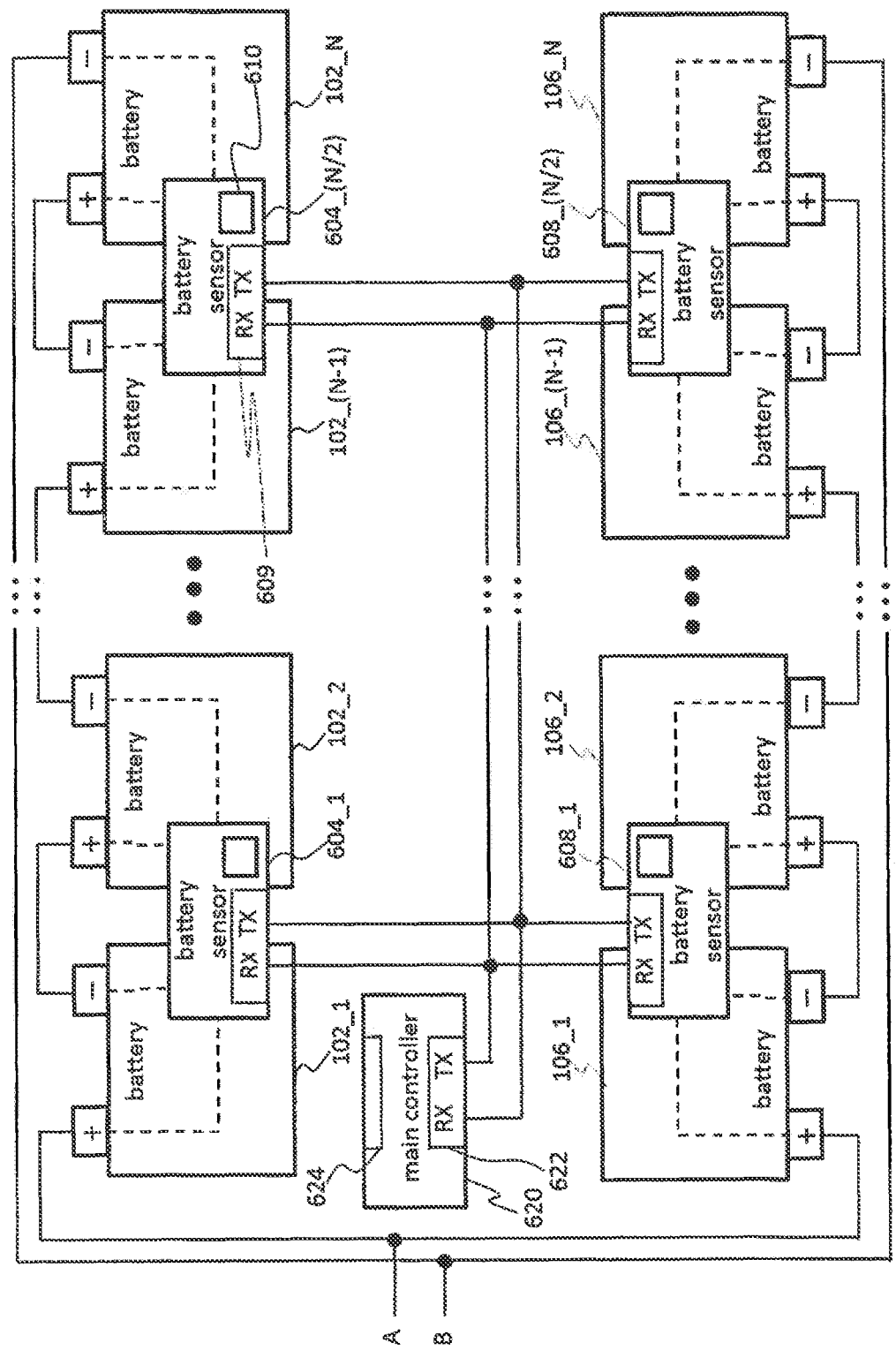
FIG. 10 shows a battery management system according to yet another embodiment of the present invention and shows two battery strings.

FIG. 10 shows a battery management system according to yet another embodiment of the present invention and shows two battery strings. In FIG. 10, the same reference numerals as those in FIG. 6 are denoted as the same objects. Compared with the battery management system shown in FIG. 6, the main controller 620 in the battery management system shown in FIG. 10 divides the batteries into a plurality of battery groups. Each of the battery groups comprises K batteries, wherein K is a natural number. In this embodiment, K is 2. In addition, each battery sensor is electrically coupled to the positive terminal and the negative terminal of each battery of a corresponding battery group, thereby receiving power supplied by each corresponding battery and sensing the state of each corresponding battery. With this configuration, the number of battery sensors required can be reduced. In the embodiment shown in FIG. 10, the number of battery sensors required is reduced by half.

Each battery sensor issues a broadcast through the communication module 609 when its power is activated. The main controller 620 is configured to execute a web server program to provide a web page. When the main controller 620 receives a broadcast, the main controller 620 displays an addressing interface by the web page, so as to assign each battery sensor to a corresponding battery group to complete the addressing of the battery sensors.

In addition, the main controller 620 further signal connects a remote device via the communication module 624. The remote device is configured to execute a browser program, thereby allowing a user to browse the web page. Thus, the user can execute or input at least one operation command through the web page.

In addition, each battery sensor further comprises a display device (as indicated by reference numeral 610) such that each battery sensor can display its addressing information through its display device 610. The display device 610 can be implemented by an LCD, an EPD, or at least a seven-segment display. Certainly, the display device 610 of each battery sensor can be replaced by an LED or an LED module. In addition, each battery sensor further comprises a memory space (not shown) for storing addressing information.

It should be noted that although the above embodiments are exemplified by two battery strings, this is not intended to limit the present invention. It will be appreciated by those of ordinary skill in the art that the number of battery sensors of the present invention can vary with the number of batteries.

Figure 11:
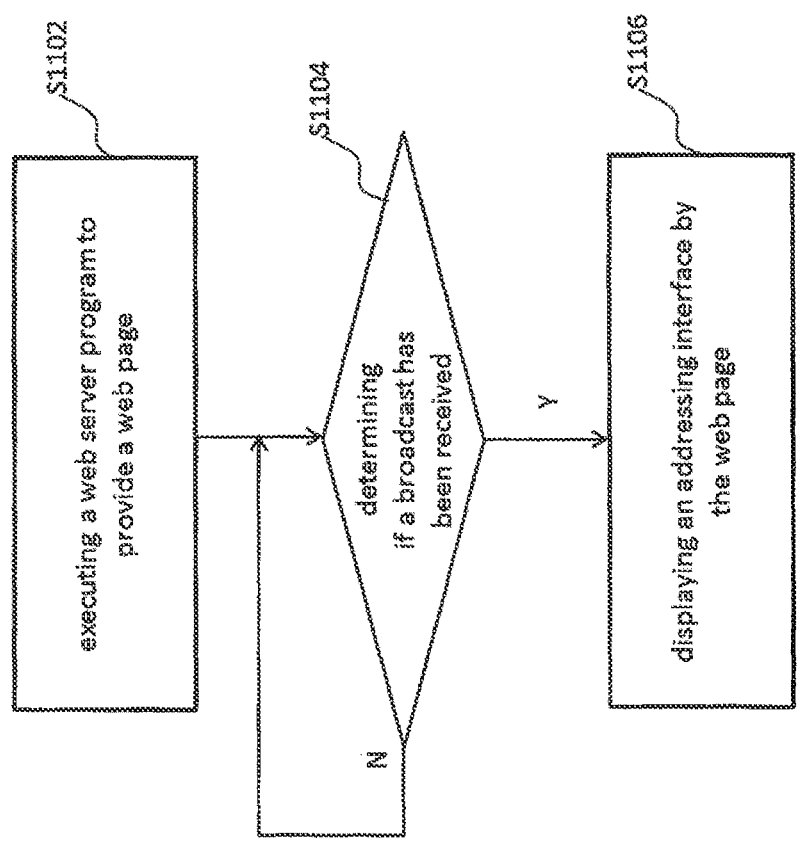
FIG. 11 shows a main operation flow of the main controller of a battery management system according to an embodiment of the present invention.

In addition, a main operation flow of the main controller of a battery management system of the present invention can be summarized by the description of the above embodiments, as shown in FIG. 11. First, the main controller executes a web server program to provide a web page (as shown in step S1102). Next, the main controller determines whether or not a broadcast has been received (as shown in step S1104). When the determination is no, the main controller returns to step S1104. On the other hand, when the determination is yes, the main controller displays an addressing interface by the web page (as shown in step S1106), so as to assign each battery sensor to at least one corresponding battery to complete the addressing of the battery sensors.

In summary, since the battery management system of the present invention can address the battery sensors by an addressing interface on a web page, this addressing manner is very suitable for a data center with a high battery density and cause great convenience to the installer. Certainly, this addressing manner also gives maintenance personnel the same convenience when the battery number in the data center needs to be expanded or when the battery sensor in the data center needs to be repaired or replaced.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A battery management system, applicable to at least one battery string, each battery string comprising a plurality of batteries connected in series, the battery management system comprising:
a plurality of battery sensors, each of the battery sensors being configured to measure at least one corresponding battery and having a first communication module, and each of the battery sensors being configured to issue a broadcast through the first communication module when its power is activated; and
a main controller, having a second communication module, wherein the second communication module and the first communication modules are signal connected in parallel, the main controller is configured to execute a web server program to provide a web page, and when the main controller receives the broadcast, the main controller displays an addressing interface by the web page, so as to assign each battery sensor to at least one corresponding battery to complete the addressing of the battery sensors,
wherein the addressing interface is configured to display information on which batteries have been assigned battery sensors and which batteries have not been assigned battery sensors, and each battery that has not been assigned a battery sensor is represented by a virtual button, and
wherein when any one of the virtual buttons is clicked, information on which battery sensors have issued broadcasts but have not been addressed pops up on the web page, so as to allow a click operation to complete the addressing of a corresponding battery sensor.

2. The battery management system as claimed in claim 1, wherein when the battery sensors are all addressed, the main controller further writes the addressing information of each battery sensor into a memory space of a corresponding battery sensor, the addressing information comprises information on which battery of the battery strings the battery sensor belongs to.

3. The battery management system as claimed in claim 2, wherein each battery sensor further comprises a display device to display the addressing information.

4. The battery management system as claimed in claim 3, wherein the display device comprises an LCD, an EPD or at least a seven-segment display.

5. The battery management system as claimed in claim 2, wherein each of the battery sensors further comprises at least one LED, and each of the battery sensors controls the LED to emit light after storing the addressing information in its memory space.

6. The battery management system as claimed in claim 2, wherein each of the battery sensors further comprises an LED module, the LED module comprises a plurality of LEDs of different colors, and each of the battery sensors controls the LED module to emit light of a corresponding color after storing the addressing information in its memory space.

7. The battery management system as claimed in claim 1, wherein each of the battery sensors further comprises at least one LED, and when the battery sensors are all addressed, the main controller further controls at least one battery sensor to turn on its LED according to an operational command received from the web page.

8. The battery management system as claimed in claim 1, wherein the main controller divides the batteries into a plurality of battery groups, each battery group comprises K batteries, wherein K is a natural number, and each battery sensor is configured to measure the batteries in a corresponding battery group.

9. The battery management system as claimed in claim 8, wherein the addressing interface is configured to display information on which battery groups have been assigned battery sensors and which battery groups have not been assigned battery sensors, the addressing interface is also configured to display information on which battery sensors have issued broadcasts but have not been addressed, so as to allow a drag operation to complete the addressing of the battery sensors.

10. The battery management system as claimed in claim 8, wherein the addressing interface is configured to display information on which battery groups have been assigned battery sensors and which battery groups have not been assigned battery sensors, and each battery group that has not been assigned a battery sensor is represented by a virtual button, when any one of the virtual buttons is clicked, information on which battery sensors have issued broadcasts but have not been addressed pops up on the web page, so as to allow a click operation to complete the addressing of a corresponding battery sensor.

11. The battery management system as claimed in claim 8, wherein the addressing interface is configured to display information on which battery groups have been assigned battery sensors and which battery groups have not been assigned battery sensors, and each battery group that has not been assigned a battery sensor is represented by a virtual button, when any one of the virtual buttons is clicked, a pull-down menu is displayed to display information on which battery sensors have issued broadcasts but have not been addressed, so as to allow a click operation to complete the addressing of a corresponding battery sensor.

12. The battery management system as claimed in claim 8, wherein the addressing interface is configured to display information on which battery groups have been assigned battery sensors and which battery groups have not been assigned battery sensors, and each battery group that has not been assigned a battery sensor is represented by a virtual button, when any one of the virtual buttons is clicked, a setting wizard interface pops up to guide a user to address a corresponding battery sensor.

13. The battery management system as claimed in claim 8, wherein the addressing interface is configured to display information on which battery groups have been assigned battery sensors and which battery groups have not been assigned battery sensors, and the main controller is configured to automatically assign the battery sensors to the corresponding battery groups according to the receiving sequence of the broadcasts, so as to complete the addressing of the battery sensors, and the main controller displays the correspondence between the battery sensors and the battery groups by the addressing interface.

14. The battery management system as claimed in claim 8, wherein when the battery sensors are all addressed, the main controller further writes the addressing information of each battery sensor into a memory space of a corresponding battery sensor, the addressing information comprises information on which battery group of the battery strings the battery sensor belongs to.

15. The battery management system as claimed in claim 14, wherein each battery sensor further comprises a display device to display the addressing information.

16. The battery management system as claimed in claim 15, wherein the display device comprises an LCD, an EPD or at least a seven-segment display.

17. The battery management system as claimed in claim 14, wherein each of the battery sensors further comprises at least one LED, and each of the battery sensors controls the LED to emit light after storing the addressing information in its memory space.

18. The battery management system as claimed in claim 14, wherein each of the battery sensors further comprises an LED module, the LED module comprises a plurality of LEDs of different colors, and each of the battery sensors controls the LED module to emit light of a corresponding color after storing the addressing information in its memory space.

19. The battery management system as claimed in claim 14, wherein each of the battery sensors further comprises at least one LED, and when the battery sensors are all addressed, the main controller further controls at least one battery sensor to turn on its LED according to an operational command received from the web page.

20. The battery management system as claimed in claim 14, wherein each of the battery sensors further comprises at least one LED, and when the battery sensors are all addressed, the main controller further controls at least one battery sensor to turn on its LED according to an operational command received from the web page.

21. The battery management system as claimed in claim 1, wherein each of the first communication module and the second communication module comprises a wired communication module.

22. The battery management system as claimed in claim 1, wherein each of the first communication module and the second communication module comprises a wireless communication module.

23. The battery management system as claimed in claim 1, wherein the main controller further comprises a third communication module, so as to signal connect a remote device via the third communication module, the remote device is configured to execute a browser program.

24. The battery management system as claimed in claim 23, wherein the third communication module comprises a wired communication module.

25. The battery management system as claimed in claim 23, wherein the third communication module comprises a wireless communication module.

26. A battery management system, applicable to at least one battery string, each battery string comprising a plurality of batteries connected in series, the battery management system comprising:
  a plurality of battery sensors, each of the battery sensors being configured to measure at least one corresponding battery and having a first communication module, and each of the battery sensors being configured to issue a broadcast through the first communication module when its power is activated; and a main controller, having a second communication module, wherein the second communication module and the first communication modules are signal connected in parallel, the main controller is configured to execute a web server program to provide a web page, and when the main controller receives the broadcast, the main controller displays an addressing interface by the web page, so as to assign each battery sensor to at least one corresponding battery to complete the addressing of the battery sensors, wherein the addressing interface is configured to display information on which batteries have been assigned battery sensors and which batteries have not been assigned battery sensors, and each battery that has not been assigned a battery sensor is represented by a virtual button, and wherein when any one of the virtual buttons is clicked, a pull-down menu is displayed to display information on which battery sensors have issued broadcasts but have not been addressed, so as to allow a click operation to complete the addressing of a corresponding battery sensor.

27. The battery management system as claimed in claim 26, wherein when the battery sensors are all addressed, the main controller further writes the addressing information of each battery sensor into a memory space of a corresponding battery sensor, the addressing information comprises information on which battery of the battery strings the battery sensor belongs to.

28. The battery management system as claimed in claim 27, wherein each battery sensor further comprises a display device to display the addressing information.

29. The battery management system as claimed in claim 28, wherein the display device comprises an LCD, an EPD or at least a seven-segment display.

30. The battery management system as claimed in claim 27, wherein each of the battery sensors further comprises at least one LED, and each of the battery sensors controls the LED to emit light after storing the addressing information in its memory space.

31. The battery management system as claimed in claim 27, wherein each of the battery sensors further comprises an LED module, the LED module comprises a plurality of LEDs of different colors, and each of the battery sensors controls the LED module to emit light of a corresponding color after storing the addressing information in its memory space.

32. The battery management system as claimed in claim 26, wherein each of the battery sensors further comprises at least one LED, and when the battery sensors are all addressed, the main controller further controls at least one battery sensor to turn on its LED according to an operational command received from the web page.

33. The battery management system as claimed in claim 26, wherein the main controller divides the batteries into a plurality of battery groups, each battery group comprises K batteries, wherein K is a natural number, and each battery sensor is configured to measure the batteries in a corresponding battery group.

34. The battery management system as claimed in claim 33, wherein the addressing interface is configured to display information on which battery groups have been assigned battery sensors and which battery groups have not been assigned battery sensors, the addressing interface is also configured to display information on which battery sensors have issued broadcasts but have not been addressed, so as to allow a drag operation to complete the addressing of the battery sensors.

35. The battery management system as claimed in claim 33, wherein the addressing interface is configured to display information on which battery groups have been assigned battery sensors and which battery groups have not been assigned battery sensors, and each battery group that has not been assigned a battery sensor is represented by a virtual button, when any one of the virtual buttons is clicked, information on which battery sensors have issued broadcasts but have not been addressed pops up on the web page, so as to allow a click operation to complete the addressing of a corresponding battery sensor.

36. The battery management system as claimed in claim 33, wherein the addressing interface is configured to display information on which battery groups have been assigned battery sensors and which battery groups have not been assigned battery sensors, and each battery group that has not been assigned a battery sensor is represented by a virtual button, when any one of the virtual buttons is clicked, a pull-down menu is displayed to display information on which battery sensors have issued broadcasts but have not been addressed, so as to allow a click operation to complete the addressing of a corresponding battery sensor.

37. The battery management system as claimed in claim 33, wherein the addressing interface is configured to display information on which battery groups have been assigned battery sensors and which battery groups have not been assigned battery sensors, and each battery group that has not been assigned a battery sensor is represented by a virtual button, when any one of the virtual buttons is clicked, a setting wizard interface pops up to guide a user to address a corresponding battery sensor.

38. The battery management system as claimed in claim 33, wherein the addressing interface is configured to display information on which battery groups have been assigned battery sensors and which battery groups have not been assigned battery sensors, and the main controller is configured to automatically assign the battery sensors to the corresponding battery groups according to the receiving sequence of the broadcasts, so as to complete the addressing of the battery sensors, and the main controller displays the correspondence between the battery sensors and the battery groups by the addressing interface.

39. The battery management system as claimed in claim 33, wherein when the battery sensors are all addressed, the main controller further writes the addressing information of each battery sensor into a memory space of a corresponding battery sensor, the addressing information comprises information on which battery group of the battery strings the battery sensor belongs to.

40. The battery management system as claimed in claim 39, wherein each battery sensor further comprises a display device to display the addressing information.

41. The battery management system as claimed in claim 40, wherein the display device comprises an LCD, an EPD or at least a seven-segment display.

42. The battery management system as claimed in claim 39, wherein each of the battery sensors further comprises at least one LED, and each of the battery sensors controls the LED to emit light after storing the addressing information in its memory space.

43. The battery management system as claimed in claim 39, wherein each of the battery sensors further comprises an LED module, the LED module comprises a plurality of LEDs of different colors, and each of the battery sensors controls the LED module to emit light of a corresponding color after storing the addressing information in its memory space.

44. The battery management system as claimed in claim 26, wherein each of the first communication module and the second communication module comprises a wired communication module.

45. The battery management system as claimed in claim 26, wherein each of the first communication module and the second communication module comprises a wireless communication module.

46. The battery management system as claimed in claim 26, wherein the main controller further comprises a third communication module, so as to signal connect a remote device via the third communication module, the remote device is configured to execute a browser program.

47. The battery management system as claimed in claim 46, wherein the third communication module comprises a wired communication module.

48. The battery management system as claimed in claim 46, wherein the third communication module comprises a wireless communication module.

49. A battery management system, applicable to at least one battery string, each battery string comprising a plurality of batteries connected in series, the battery management system comprising:
a plurality of battery sensors, each of the battery sensors being configured to measure at least one corresponding battery and having a first communication module, and each of the battery sensors being configured to issue a broadcast through the first communication module when its power is activated; and
a main controller, having a second communication module, wherein the second communication module and the first communication modules are signal connected in parallel, the main controller is configured to execute a web server program to provide a web page, and when the main controller receives the broadcast, the main controller displays an addressing interface by the web page, so as to assign each battery sensor to at least one corresponding battery to complete the addressing of the battery sensors,
wherein the addressing interface is configured to display information on which batteries have been assigned battery sensors and which batteries have not been assigned battery sensors, and each battery that has not been assigned a battery sensor is represented by a virtual button, and
wherein when any one of the virtual buttons is clicked, a setting wizard interface pops up to guide a user to address a corresponding battery sensor.

50. The battery management system as claimed in claim 49, wherein when the battery sensors are all addressed, the main controller further writes the addressing information of each battery sensor into a memory space of a corresponding battery sensor, the addressing information comprises information on which battery of the battery strings the battery sensor belongs to.

51. The battery management system as claimed in claim 50, wherein each battery sensor further comprises a display device to display the addressing information.

52. The battery management system as claimed in claim 51, wherein the display device comprises an LCD, an EPD or at least a seven-segment display.

53. The battery management system as claimed in claim 50, wherein each of the battery sensors further comprises at least one LED, and each of the battery sensors controls the LED to emit light after storing the addressing information in its memory space.

54. The battery management system as claimed in claim 50, wherein each of the battery sensors further comprises an LED module, the LED module comprises a plurality of LEDs of different colors, and each of the battery sensors controls the LED module to emit light of a corresponding color after storing the addressing information in its memory space.

55. The battery management system as claimed in claim 49, wherein each of the battery sensors further comprises at least one LED, and when the battery sensors are all addressed, the main controller further controls at least one battery sensor to turn on its LED according to an operational command received from the web page.

56. The battery management system as claimed in claim 49, wherein the main controller divides the batteries into a plurality of battery groups, each battery group comprises K batteries, wherein K is a natural number, and each battery sensor is configured to measure the batteries in a corresponding battery group.

57. The battery management system as claimed in claim 56, wherein the addressing interface is configured to display information on which battery groups have been assigned battery sensors and which battery groups have not been assigned battery sensors, the addressing interface is also configured to display information on which battery sensors have issued broadcasts but have not been addressed, so as to allow a drag operation to complete the addressing of the battery sensors.

58. The battery management system as claimed in claim 56, wherein the addressing interface is configured to display information on which battery groups have been assigned battery sensors and which battery groups have not been assigned battery sensors, and each battery group that has not been assigned a battery sensor is represented by a virtual button, when any one of the virtual buttons is clicked, information on which battery sensors have issued broadcasts but have not been addressed pops up on the web page, so as to allow a click operation to complete the addressing of a corresponding battery sensor.

59. The battery management system as claimed in claim 56, wherein the addressing interface is configured to display information on which battery groups have been assigned battery sensors and which battery groups have not been assigned battery sensors, and each battery group that has not been assigned a battery sensor is represented by a virtual button, when any one of the virtual buttons is clicked, a pull-down menu is displayed to display information on which battery sensors have issued broadcasts but have not been addressed, so as to allow a click operation to complete the addressing of a corresponding battery sensor.

60. The battery management system as claimed in claim 56, wherein the addressing interface is configured to display information on which battery groups have been assigned battery sensors and which battery groups have not been assigned battery sensors, and each battery group that has not been assigned a battery sensor is represented by a virtual button, when any one of the virtual buttons is clicked, a setting wizard interface pops up to guide a user to address a corresponding battery sensor.

61. The battery management system as claimed in claim 56, wherein the addressing interface is configured to display information on which battery groups have been assigned battery sensors and which battery groups have not been assigned battery sensors, and the main controller is configured to automatically assign the battery sensors to the corresponding battery groups according to the receiving sequence of the broadcasts, so as to complete the addressing of the battery sensors, and the main controller displays the correspondence between the battery sensors and the battery groups by the addressing interface.

62. The battery management system as claimed in claim 56, wherein when the battery sensors are all addressed, the main controller further writes the addressing information of each battery sensor into a memory space of a corresponding battery sensor, the addressing information comprises information on which battery group of the battery strings the battery sensor belongs to.

63. The battery management system as claimed in claim 62, wherein each battery sensor further comprises a display device to display the addressing information.

64. The battery management system as claimed in claim 63, wherein the display device comprises an LCD, an EPD or at least a seven-segment display.

65. The battery management system as claimed in claim 62, wherein each of the battery sensors further comprises at least one LED, and each of the battery sensors controls the LED to emit light after storing the addressing information in its memory space.

66. The battery management system as claimed in claim 62, wherein each of the battery sensors further comprises an LED module, the LED module comprises a plurality of LEDs of different colors, and each of the battery sensors controls the LED module to emit light of a corresponding color after storing the addressing information in its memory space.

67. The battery management system as claimed in claim 62, wherein each of the battery sensors further comprises at least one LED, and when the battery sensors are all addressed, the main controller further controls at least one battery sensor to turn on its LED according to an operational command received from the web page.

68. The battery management system as claimed in claim 49, wherein each of the first communication module and the second communication module comprises a wired communication module.

69. The battery management system as claimed in claim 49, wherein each of the first communication module and the second communication module comprises a wireless communication module.

70. The battery management system as claimed in claim 49, wherein the main controller further comprises a third communication module, so as to signal connect a remote device via the third communication module, the remote device is configured to execute a browser program.

71. The battery management system as claimed in claim 70, wherein the third communication module comprises a wired communication module.

72. The battery management system as claimed in claim 70, wherein the third communication module comprises a wireless communication module.

\* \* \* \* \*